United States Patent
Limaye et al.

(10) Patent No.: US 11,347,514 B2
(45) Date of Patent: May 31, 2022

(54) CONTENT-ADDRESSABLE MEMORY FILTERING BASED ON MICROARCHITECTURAL STATE

(71) Applicant: Apple Inc., Cupertino, CA (US)

(72) Inventors: Deepak Limaye, Cedar Park, TX (US); Brian R. Mestan, Austin, TX (US); Gideon N. Levinsky, Austin, TX (US)

(73) Assignee: Apple Inc., Cupertino, CA (US)

( * ) Notice: Subject to any disclaimer, the term of this patent is extended or adjusted under 35 U.S.C. 154(b) by 626 days.

(21) Appl. No.: 16/277,764

(22) Filed: Feb. 15, 2019

(65) Prior Publication Data

US 2020/0264888 A1 Aug. 20, 2020

(51) Int. Cl.
| | |
|---|---|
| *G06F 12/00* | (2006.01) |
| *G06F 9/38* | (2018.01) |
| *G06F 12/0815* | (2016.01) |
| *G06F 12/0891* | (2016.01) |
| *G06F 12/0864* | (2016.01) |

(52) U.S. Cl.
CPC .......... *G06F 9/3851* (2013.01); *G06F 9/3834* (2013.01); *G06F 9/3855* (2013.01); *G06F 9/3859* (2013.01); *G06F 12/0815* (2013.01); *G06F 12/0864* (2013.01); *G06F 12/0891* (2013.01)

(58) Field of Classification Search
CPC .... G06F 9/3851; G06F 9/3834; G06F 9/3855; G06F 9/3859; G06F 12/0815; G06F 12/0864; G06F 12/0891
See application file for complete search history.

(56) References Cited

U.S. PATENT DOCUMENTS

| | | | | |
|---|---|---|---|---|
| 5,682,515 A | * | 10/1997 | Lau ...................... | G06F 12/0864 711/118 |
| 6,262,929 B1 | * | 7/2001 | Miyatake ................. | G11C 7/12 365/203 |
| 6,629,218 B2 | | 9/2003 | Cho | |
| 6,681,300 B2 | | 1/2004 | Wolrich et al. | |
| 7,064,971 B2 | * | 6/2006 | Shau ...................... | G11C 15/04 365/195 |
| 7,602,629 B2 | * | 10/2009 | Wickeraad ............. | G11C 15/04 365/49.1 |
| 7,936,577 B1 | * | 5/2011 | Fabry ..................... | G11C 15/04 365/49.17 |
| 10,102,117 B2 | | 10/2018 | Talagala et al. | |
| 2006/0171184 A1 | * | 8/2006 | Khurana ................ | G11C 15/04 365/49.17 |

(Continued)

*Primary Examiner* — Reginald G Bragdon
*Assistant Examiner* — Michael L Westbrook
(74) *Attorney, Agent, or Firm* — Kowert, Hood, Munyon, Rankin & Goetzel, P.C.

(57) ABSTRACT

Techniques are disclosed relating to filtering access to a content-addressable memory (CAM). In some embodiments, a processor monitors for certain microarchitectural states and filters access to the CAM in states where there cannot be a match in the CAM or where matching entries will not be used even if there is a match. In some embodiments, toggle control circuitry prevents toggling of input lines when filtering CAM access, which may reduce dynamic power consumption. In some example embodiments, the CAM is used to access a load queue to validate that out-of-order execution for a set of instructions matches in-order execution, and situations where ordering should be checked are relatively rare.

17 Claims, 5 Drawing Sheets

(56) References Cited

U.S. PATENT DOCUMENTS

| | | | |
|---|---|---|---|
| 2012/0054426 A1* | 3/2012 | Shen | G11C 15/04 |
| | | | 711/108 |
| 2012/0147642 A1* | 6/2012 | Gronlund | G11C 15/04 |
| | | | 365/49.1 |
| 2018/0074827 A1 | 3/2018 | Mekkat et al. | |

* cited by examiner

CONTENT-ADDRESSABLE MEMORY FILTERING BASED ON MICROARCHITECTURAL STATE

BACKGROUND

Technical Field

This disclosure relates generally to content-addressable memory (CAM) and more particularly to filtering CAM accesses based on architectural state of a processor.

Description of the Related Art

Content-addressable memory is used for various comparison in computer processors (e.g., to detect cache hits or to detect loads/stores to the same address for out-of-order execution). Rather than specifying an address of data to be retrieved, an access to a CAM specifies input data, which is compared to content in multiple CAM entries to determine whether there is a match. Because of this, CAMs typically consume considerable power in a processor.

Figure 1:
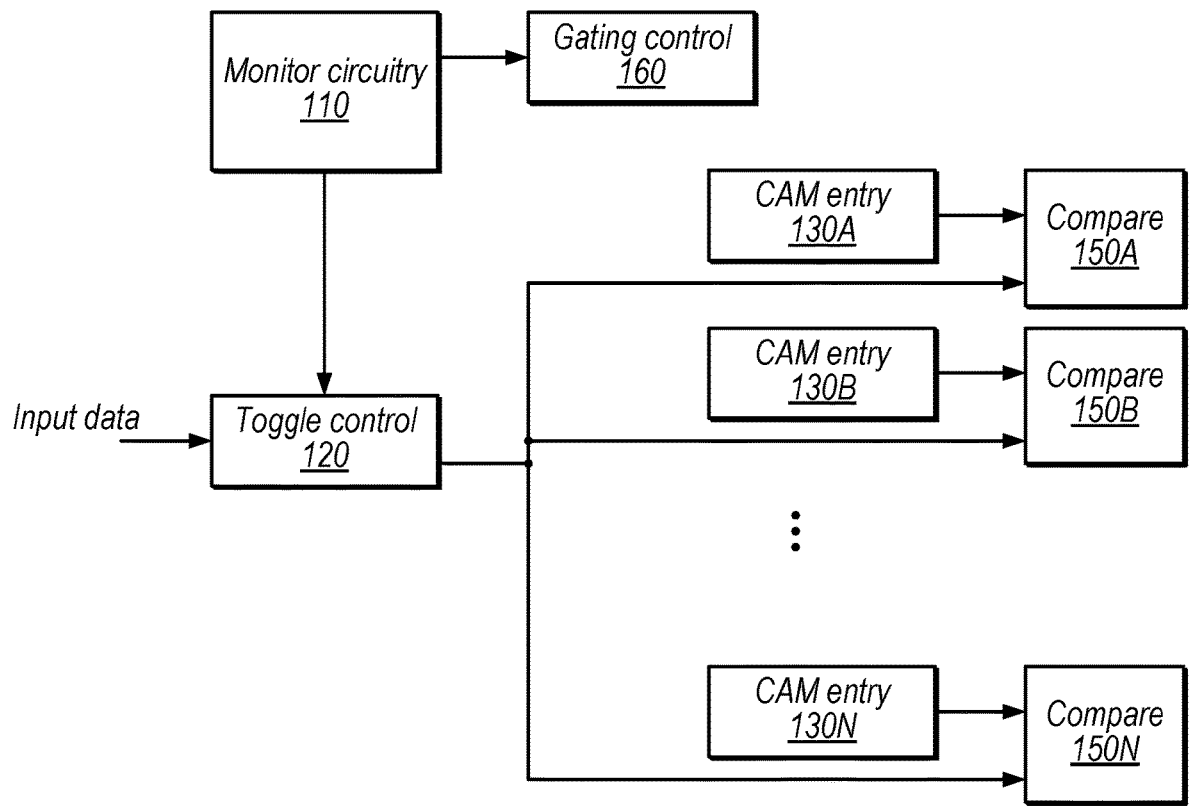
FIG. 1 is a block diagram illustrating example filter control circuitry for a CAM, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. "Address comparison circuitry configured to compare two addresses" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

Further, as used herein, the terms "first," "second," "third," etc. do not necessarily imply an ordering (e.g., temporal) between elements. For example, a referring to a "first" graphics operation and a "second" graphics operation does not imply an ordering of the graphics operation, absent additional language constraining the temporal relationship between these operations. In short, references such as "first," "second," etc. are used as labels for ease of reference in the description and the appended claims.

DETAILED DESCRIPTION

Overview of Cache Filtering

In various embodiments, a content-addressable memory (CAM) includes multiple entries and is configured to compare at least a portion of the entries with input data to determine whether there are one or more matches. In some embodiments, the CAM may then output additional information from the one or more matching entries. These general concepts of concept-addressable memory are well-understood to those skilled in the art.

Based on microarchitectural state of a processor, in some embodiments, control circuitry is configured to filter CAM accesses, which may substantially reduce power consumption. For example, state information may indicate that a match is not possible or that no action will be taken even if there is a match. In these situations, toggling input lines and performing comparisons may waste power. In some embodiments, control circuitry may disable toggling of input lines to all or a portion of a CAM in these situations.

FIG. 1 is a block diagram illustrating example circuitry configured to filter CAM access, according to some embodiments. In the illustrated embodiment, a processor includes monitor circuitry 110, toggle control circuitry 120, CAM entries 130A-130N, compare circuits 150A-150N, and gating control circuitry 160.

CAM entries 130, in the illustrated embodiment, store content to be compared with the input data to determine where there is a match in the CAM. In the illustrated embodiment, compare circuits 150 are configured to compare the input data with each CAM entry 130. In some embodiments, the CAM entries 130 store additional information to be provided in response to a match. For example, a CAM for a cache may provide cached data in response to a hit to a particular address. As another example, a load buffer may provide load information for loads to a provided address, e.g., to satisfy memory consistency requirements. Note that these comparisons and toggling input lines to change the input data may consume substantial power, particularly when the number of CAM entries 130 is large or if multiple inputs are provided, e.g., to multi-ported CAMs.

Monitor circuitry 110, in some embodiments, is configured to monitor for a particular state of the processor. In some embodiments, the state is determined based on other information in the CAM entries that is not matched with the input data (e.g., information that would be output from the CAM in response to a match). In some embodiments, the state is determined, at least in part, based on information that is stored externally to the CAM. In some embodiments, monitor control circuitry 110 is configured to control one or both of toggle control circuitry 120 and gating control circuitry 160 to filter CAM use in certain processor states. Note that the filtering may be performed at different granularities, e.g., disabling access to the entire CAM or to only a portion of the entries of the CAM.

Toggle control circuitry 120, in the illustrated embodiment, is configured to prevent toggling of the input lines to the compare circuits 150 based on control signaling from monitor circuitry 110. As one example, if a control signal is high to indicate the CAM should be used and low to indicate that the CAM should not be used, toggle control circuitry 120 may logically AND the input data with the control signal. In this example, toggle control circuitry 120 outputs low signals on the comparison input lines (e.g., all logical zeros) when the control signal is low. As another example, toggle control circuitry 120 may include a register that maintains the most-recently-used value of the input data and may be configured to continue outputting this same value if the control signal indicates the CAM should not be used. Speaking generally, keeping a circuit static avoids discharging capacitance and thus reduces dynamic power consumption.

Gating control circuitry 160, in some embodiments, is configured to gate other circuitry when monitor circuitry 110 indicates CAM filtering should occur. For example, gating control circuitry 160 may clock gate or power gate all or a portion of compare circuits 150 in these situations. In some embodiments, gating control circuitry 160 may clock or power gate other downstream circuitry that is not included in the CAM.

In various embodiments, the disclosed techniques may reduce power consumption associated with a CAM in processor states where CAM comparisons are not needed. This may be particularly useful in contexts where these states are common, e.g., because the event for which CAM functionality is needed is relatively rare. These contexts may be more common in operations for which multiple different comparisons are being performed to determine whether to perform an action.

Example Filtering of a CAM for Load/Load Ordering

Figure 2:
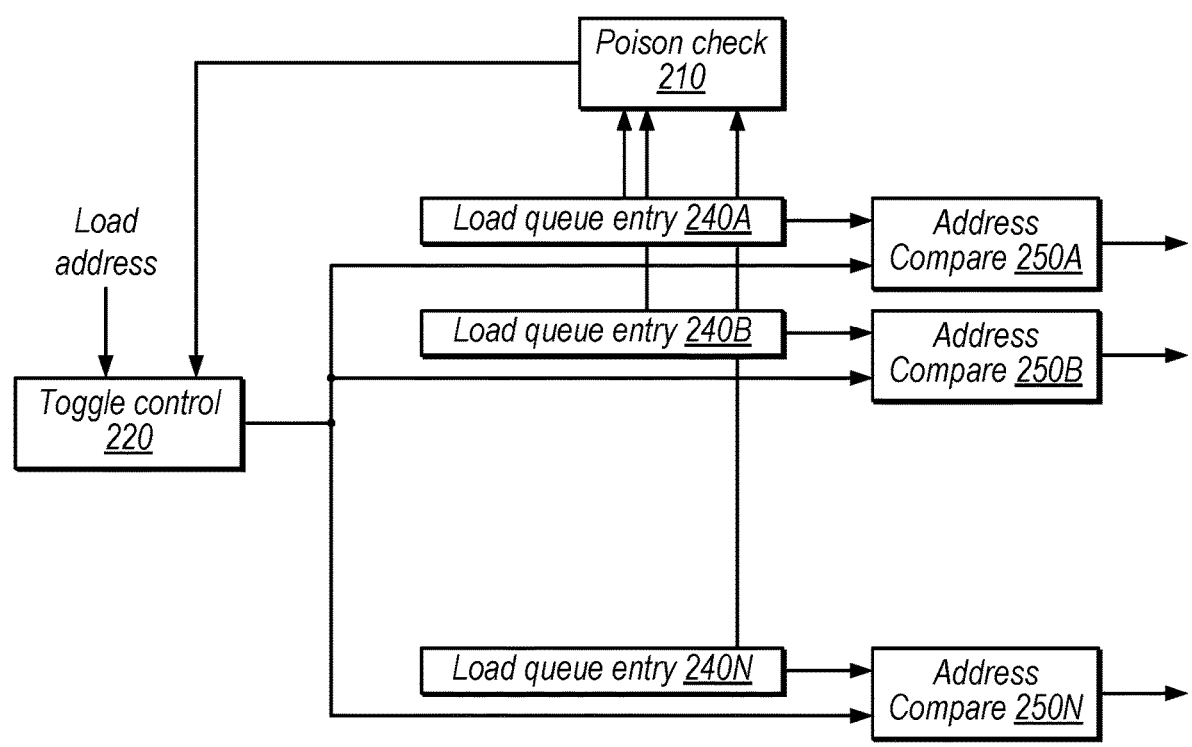
FIG. 2 is a block diagram illustrating example toggle control circuitry for a load queue based on a poison check, according to some embodiments.

FIG. 2 is a block diagram illustrating an example of CAM filtering in the context of load/load ordering, according to some embodiments. Note that the example of FIG. 2 is included for purposes of illustration, but is not intended to limit the scope of the present disclosure. In other embodiments, similar techniques may be used based on various different processor states. In the illustrated embodiment, a processor includes poison check circuitry 210, toggle control circuitry 220, load queue entries 240A-240N, and address compare circuits 250A-250N.

Address compare circuits 250A-250N, in the illustrated embodiment, are configured to determine whether the load address that is input to toggle control circuitry 220 matches the address of any loads in the load queue entries 240A-240N. When a load to the same address is found, it may be checked to determine whether speculative execution followed memory ordering rules.

In some embodiments, the processor implements a relaxed memory ordering model in which loads to different addresses are allowed to complete out of order (note that the disclosed techniques are also relevant to architectures with more strict ordering requirements, but relaxed memory ordering is discussed for purposes of explanation for non-limiting example embodiments below). When allowing out-of-order load execution in relaxed memory ordering models, a situation may occur where a younger load completes to a given address, an older load is later issued to the same address, and the corresponding cache line was lost in the interim (e.g., the line was snooped out by another processor core accessing a shared variable or evicted due to local cache replacement policies). The younger load may be issued first because the older load is waiting for its sources to be available to compute the target address, for example. In this situation, there may be no way to guarantee that the older load did not get a newer value than the younger load, which would violate the memory ordering model (a read-read memory consistency violation). In some embodiments, in response to detecting this scenario, the processor may flush the younger load and restart from a point after the older load. This event may be rare, however, in various processor implementations (e.g., because the chances of a cache line being lost after being accessed for the younger load is unlikely, given caching techniques such as least-recently-used policies).

In some embodiments, each load queue entry 240 includes a poison field (e.g., a bit) that indicates whether a cache line that includes the corresponding address has been lost from the processor core. Note that the cache line may be present in a next level cache, which may be shared, or may be located elsewhere in the system, but the processor core has lost visibility to the line and should assume that some other agent may have overwritten the line. Speaking generally, a poison indication may indicate that a cached value may have been overwritten by some other agent. In some embodiments, a first value of the poison field indicates that the cache line corresponding to the load is still valid in the cache while a second value of the poison field indicates that the cache line is not valid (e.g., due to eviction, invalidation, etc.).

Toggle control circuitry 220, in the illustrated embodiment, receives an input address of a new load operation and determines whether to toggle the input lines to address compare circuitry 250A. In some embodiments, when poison check circuitry 210 indicates that no entries have been poisoned, toggle control circuitry 220 is configured not to toggle the input lines to reduce power consumption. In this situation where no loads are poisoned, no further action would be taken even if there was a CAM match. Poison check circuitry 210 may be implemented using an OR gate, for example.

In some embodiments, a load queue entry may be associated with a particular hardware thread, e.g., in simultaneous multithreading designs. In these embodiments, the CAM may be filtered for an access by a first thread when there are no poisoned entries for that thread even though there are poisoned entries for another thread. Speaking generally, state to determine whether to filter the CAM may be checked on a per-thread basis or at other granularities.

In various embodiments, the disclosed filtering techniques may be implemented at different CAM granularities. For example, in the embodiment of FIG. 2, poison check circuitry 210 may block toggling of input lines only if no load queue entries 240 have been poisoned. In other embodiments, toggle control circuitry 220 may separately control different portions of the input lines. For example, toggle control circuitry 220 may block toggling to three quarters of the input lines in response to determining that no load queue entries corresponding to those quarters are poisoned, but allow toggling to the remaining quarter based on one or more corresponding load queue entries are poisoned. In other embodiments, toggle control circuitry 220 may determine whether to block input lines on a per-entry basis. Thus, the input lines to a CAM may be separated into any appropriate number of portions and receive separate toggle controlled based on entry data in the corresponding parts of the CAM, in some embodiments.

Additional CAM Filtering Examples

Another example use of CAM filtering involves interactions between loads and stores. In some embodiments, loads are allowed to retrieve their load data ahead of older stores, but should be flushed and replayed if there is an older store to the same address after the load has speculatively completed. In some embodiments, the device is configured to check a load queue for younger loads to the same address as a store instruction.

In this scenario, there may be multiple checks being performed to determine whether to flush one or more loads. For example, in some embodiments loads should be flushed from load queue entries that (a) are valid, (b), hold younger loads, (c) are to the same address as the store at issue, and (d) have received their load data. In some embodiments, filter circuitry may determine to filter CAM access (e.g., by refraining from toggling input lines) based on one or more of these checks failing.

For example, the filter circuitry may filter CAM access if there are no valid younger loads that have received their load data. More generally, in some embodiments, the filter circuitry may consider one of the following information for load queue entries in determining whether to filter: valid indications, one or more portions of the address (e.g., only the index portion of the address rather than the full portion of the address that would be compared for a CAM access), age information, and completion information (e.g., indicating whether loads have received their data). In situations where this information is sufficient to determine that no loads in all or a portion of the load queue should be flushed, the filter circuitry may filter CAM access to that portion of the load queue.

As another example, the disclosed technique may be used for fill forward operations in which loads waiting on data should be woken up when the data is retrieved from a cache or memory (e.g., when forwarding data that is also being cached). In some embodiments, portions of the CAM with no entries that are waiting for a fill may be filtered.

As yet another example, the disclosed techniques may be used for memory barrier filtering, where a memory barrier instructions CAMs a load queue or store queue to determine if any load or store instructions have been poisoned and should be replayed upon completion of a barrier operation. In some embodiments, the disclosed techniques may be used to filter CAM accesses for such barrier operations. For example, the CAM may be filtered when there are no poisoned entries, which may reduce power consumption in situations where poisoning is relatively rare.

Various disclosed embodiments use data in CAM entries (e.g., a poison indication) to determine whether to filter CAM access that attempts to match other data in the entries (e.g., address information). In some embodiments, however, filtering decisions may be based on other information in addition to or in place of information stored in CAM entries. For example, various exception state or power state information may be considered in determining whether to filter CAM accesses.

Example Method

Figure 3:
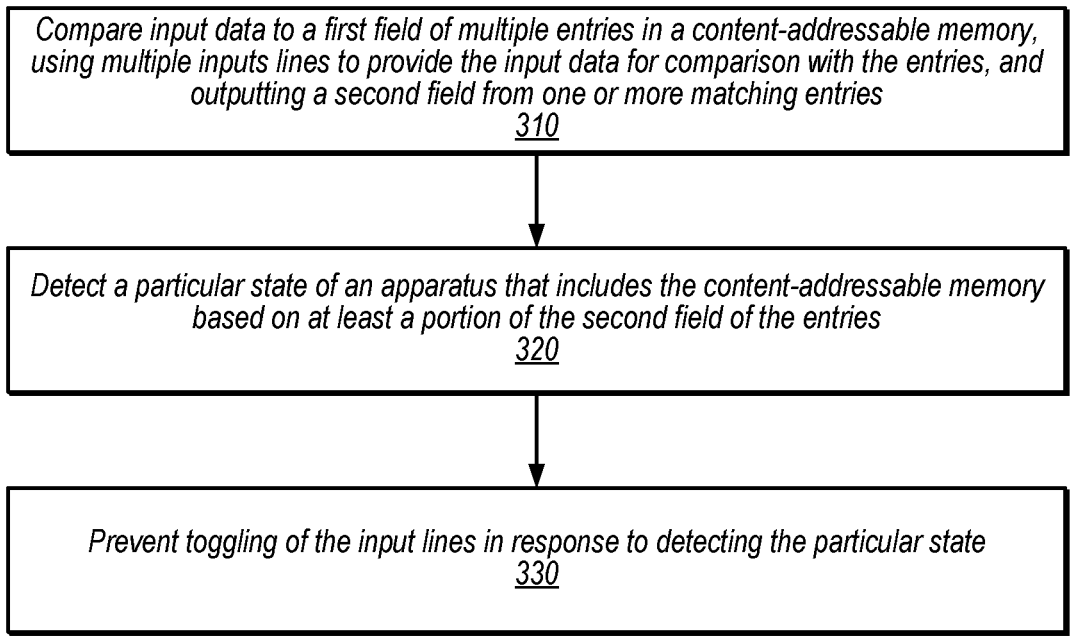
FIG. 3 is a flow diagram illustrating an example method for filtering CAM accesses, according to some embodiments.

FIG. 3 is a flow diagram illustrating a method 300 for filtering CAM accesses, according to some embodiments. The method shown in FIG. 3 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 310, in the illustrated embodiment, a content-addressable memory compares input data to a first field of multiple entries in the content-addressable memory. In the illustrated embodiment, the CAM uses multiple inputs lines to provide the input data for comparison with the entries and outputs a second field from one or more matching entries. In some embodiments, the first field indicates a load address and the second field includes a poison indicator. In some embodiments, the content-addressable memory is a load queue and the apparatus is configured to check the load queue for younger load operations that target the same address as a store operation. In some embodiments, the portion of the second field includes one or more of: a valid indication for a load queue entry, a portion of an address of a load corresponding to a load queue entry, information indicating an age of a load corresponding to a load queue entry, or information indicating whether a load corresponding to a load queue entry has received its load data.

At 320, in the illustrated embodiment, monitor circuitry detects a particular state of an apparatus that includes the content-addressable memory based on at least a portion of the second field of the entries. As one example, referring the embodiment of FIG. 2, the particular state may be a state in which no load queue entries in the corresponding portion of the load queue are poisoned. As another example, the particular state may be a state in which no valid loads in the load queue that are younger than an input store operation have completed.

At 330, in the illustrated embodiment, toggle control circuitry prevents toggling of the input lines in response to detecting the particular state. In some embodiments, the toggle control circuitry is configured to pass new values to the input lines in one or more other states.

In some embodiments, the toggle control circuitry is configured to separately control toggling of input lines for different portions of the content-addressable memory based on data in the second field of entries in the different portions of the content-addressable memory. In some embodiments, the apparatus is configured to clock gate circuitry of the content-addressable memory in response to detecting the particular state.

Example Device

Figure 4:
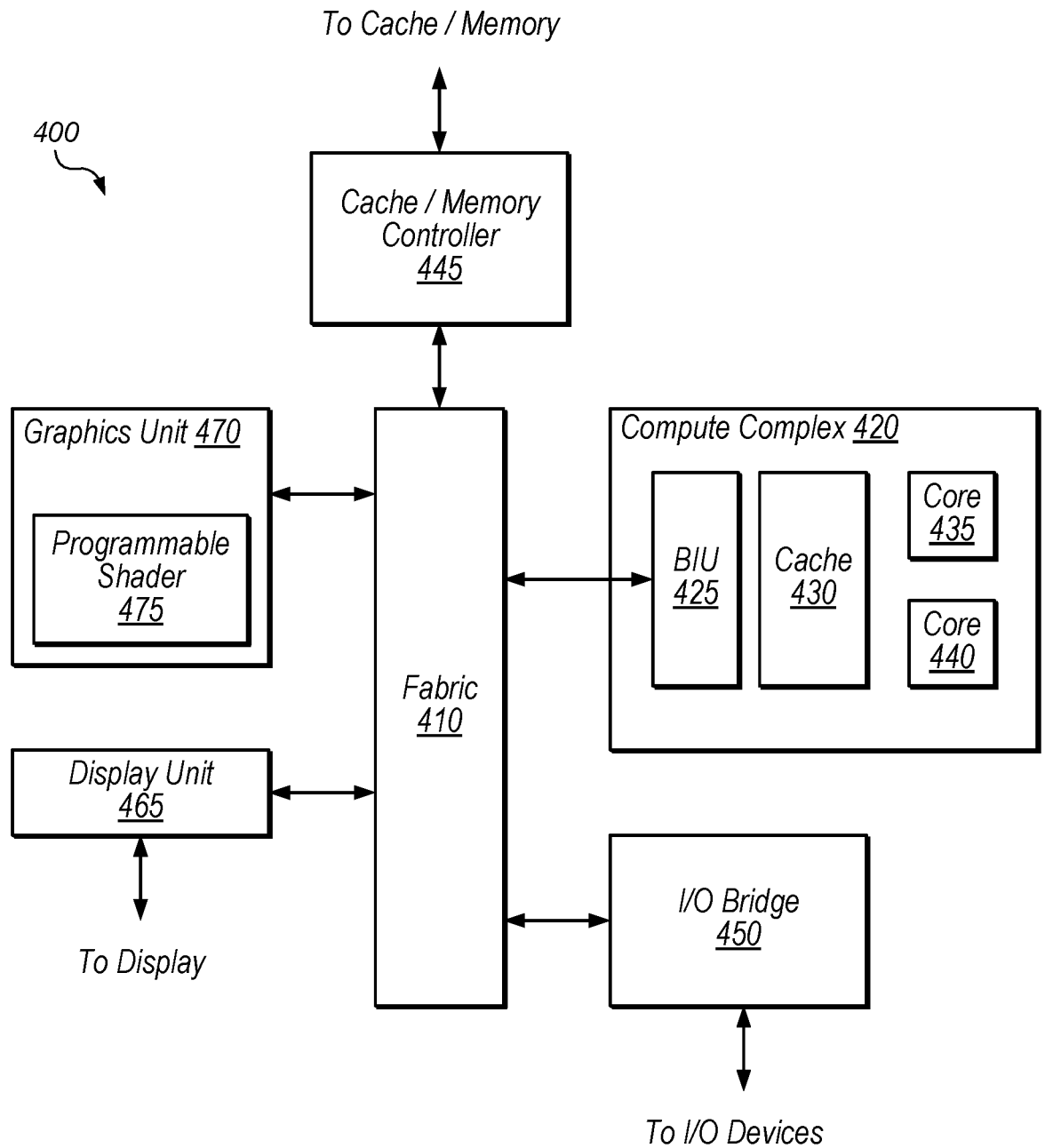
FIG. 4 is a block diagram illustrating an example computing device that includes one or more CAMs, according to some embodiments.

Referring now to FIG. 4, a block diagram illustrating an example embodiment of a device 400 is shown. In some embodiments, elements of device 400 may be included within a system on a chip. In some embodiments, device 400 may be included in a mobile device, which may be battery-powered. Therefore, power consumption by device 400 may be an important design consideration. In the illustrated embodiment, device 400 includes fabric 410, compute complex 420 input/output (I/O) bridge 450, cache/memory controller 445, graphics unit 470, and display unit 465. In some embodiments, device 400 may include other components (not shown) in addition to and/or in place of the illustrated components, such as video processor encoders and decoders, image processing or recognition elements, computer vision elements, etc.

The techniques disclosed herein may be utilized for CAMs in various types of computing devices, such as the device shown in FIG. 4. For example, the disclosed techniques may be implemented for one or more CAMs in graphics unit 470 or in cores 435 and 440.

Fabric 410 may include various interconnects, buses, MUX's, controllers, etc., and may be configured to facilitate communication between various elements of device 400. In some embodiments, portions of fabric 410 may be configured to implement various different communication protocols. In other embodiments, fabric 410 may implement a single communication protocol and elements coupled to fabric 410 may convert from the single communication protocol to other communication protocols internally.

In the illustrated embodiment, compute complex 420 includes bus interface unit (BIU) 425, cache 430, and cores 435 and 440. In various embodiments, compute complex 420 may include various numbers of processors, processor cores and/or caches. For example, compute complex 420 may include 1, 2, or 4 processor cores, or any other suitable number. In one embodiment, cache 430 is a set associative L2 cache. In some embodiments, cores 435 and/or 440 may include internal instruction and/or data caches. In some embodiments, a coherency unit (not shown) in fabric 410, cache 430, or elsewhere in device 400 may be configured to maintain coherency between various caches of device 400. BIU 425 may be configured to manage communication between compute complex 420 and other elements of device 400. Processor cores such as cores 435 and 440 may be configured to execute instructions of a particular instruction set architecture (ISA) which may include operating system instructions and user application instructions.

Cache/memory controller 445 may be configured to manage transfer of data between fabric 410 and one or more caches and/or memories. For example, cache/memory controller 445 may be coupled to an L3 cache, which may in turn be coupled to a system memory. In other embodiments, cache/memory controller 445 may be directly coupled to a memory. In some embodiments, cache/memory controller 445 may include one or more internal caches.

As used herein, the term "coupled to" may indicate one or more connections between elements, and a coupling may include intervening elements. For example, in FIG. 4, graphics unit 470 may be described as "coupled to" a memory through fabric 410 and cache/memory controller 445. In contrast, in the illustrated embodiment of FIG. 4, graphics unit 470 is "directly coupled" to fabric 410 because there are no intervening elements.

Graphics unit 470 may include one or more processors and/or one or more graphics processing units (GPU's). Graphics unit 470 may receive graphics-oriented instructions, such as OPENGL®, Metal, or DIRECT3D® instructions, for example. Graphics unit 470 may execute specialized GPU instructions or perform other operations based on the received graphics-oriented instructions. Graphics unit 470 may generally be configured to process large blocks of data in parallel and may build images in a frame buffer for output to a display. Graphics unit 470 may include transform, lighting, triangle, and/or rendering engines in one or more graphics processing pipelines. Graphics unit 470 may output pixel information for display images. In some embodiments, graphics unit 470 is configured to perform one or more of the memory consistency, mid-render compute, local image block, and/or pixel resource synchronization techniques discussed above. Programmable shader 475, in various embodiments, may include highly parallel execution cores configured to execute graphics programs, which may include pixel tasks, vertex tasks, and compute tasks (which may or may not be graphics-related).

Display unit 465 may be configured to read data from a frame buffer and provide a stream of pixel values for display. Display unit 465 may be configured as a display pipeline in some embodiments. Additionally, display unit 465 may be configured to blend multiple frames to produce an output frame. Further, display unit 465 may include one or more interfaces (e.g., MIPI® or embedded display port (eDP)) for coupling to a user display (e.g., a touchscreen or an external display).

I/O bridge 450 may include various elements configured to implement: universal serial bus (USB) communications, security, audio, and/or low-power always-on functionality, for example. I/O bridge 450 may also include interfaces such as pulse-width modulation (PWM), general-purpose input/output (GPIO), serial peripheral interface (SPI), and/or inter-integrated circuit (I2C), for example. Various types of peripherals and devices may be coupled to device 400 via I/O bridge 450.

Example Computer-Readable Medium

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 5:
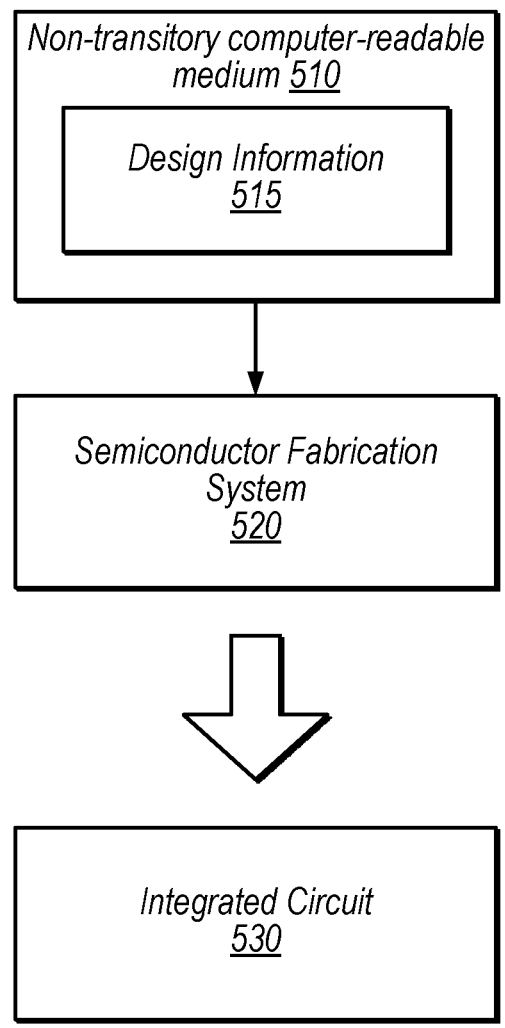
FIG. 5 is a block diagram illustrating an example computer-readable medium that stores circuit design information, according to some embodiments.

FIG. 5 is a block diagram illustrating an example non-transitory computer-readable storage medium that stores circuit design information, according to some embodiments. In the illustrated embodiment semiconductor fabrication system 520 is configured to process the design information 515 stored on non-transitory computer-readable medium 510 and fabricate integrated circuit 530 based on the design information 515.

Non-transitory computer-readable storage medium 510, may comprise any of various appropriate types of memory devices or storage devices. Non-transitory computer-readable storage medium 510 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 510 may include other types of non-transitory memory as well or combinations thereof. Non-transitory computer-readable storage medium 510 may include two or more memory mediums which may reside in different locations, e.g., in different computer systems that are connected over a network.

Design information 515 may be specified using any of various appropriate computer languages, including hardware description languages such as, without limitation: VHDL, Verilog, SystemC, SystemVerilog, RHDL, M, MyHDL, etc. Design information 515 may be usable by semiconductor fabrication system 520 to fabricate at least a portion of integrated circuit 530. The format of design information 515 may be recognized by at least one semiconductor fabrication system 520. In some embodiments, design information 515 may also include one or more cell libraries which specify the synthesis and/or layout of integrated circuit 530. In some embodiments, the design information is specified in whole or in part in the form of a netlist that specifies cell library elements and their connectivity. Design information 515, taken alone, may or may not include sufficient information for fabrication of a corresponding integrated circuit. For example, design information 515 may specify the circuit elements to be fabricated but not their physical layout. In this case, design information 515 may need to be combined with layout information to actually fabricate the specified circuitry.

Integrated circuit 530 may, in various embodiments, include one or more custom macrocells, such as memories, analog or mixed-signal circuits, and the like. In such cases, design information 515 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 520 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 520 may also be configured to perform various testing of fabricated circuits for correct operation.

In various embodiments, integrated circuit 530 is configured to operate according to a circuit design specified by design information 515, which may include performing any of the functionality described herein. For example, integrated circuit 530 may include any of various elements shown in FIG. 1, 2, or 5. Further, integrated circuit 530 may be configured to perform various functions described herein in conjunction with other components. Further, the functionality described herein may be performed by multiple connected integrated circuits.

As used herein, a phrase of the form "design information that specifies a design of a circuit configured to . . ." does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a content-addressable memory configured to compare input data to a first field of multiple entries in the content-addressable memory, using multiple input lines to provide the input data for comparison with the entries, and output a second field from one or more matching entries;
   monitor circuitry configured to detect a particular state of the apparatus based on at least a portion of the second field of the entries; and
   toggle control circuitry configured to prevent toggling of the input lines in response to the monitor circuitry detecting the particular state, wherein the toggle control circuitry is configured to separately control toggling of input lines for different portions of the content-addressable memory based on data in the second field of entries in the different portions of the content-addressable memory, such that toggling is prevented for input lines to at least one portion of the content-addressable memory and toggling is performed for one or more input lines to another portion.

2. The apparatus of claim 1, wherein the first field indicates a load address and the second field includes a poison indicator.

3. The apparatus of claim 2, wherein the poison indicator indicates whether a cache line corresponding to a load to the load address remains valid in a cache.

4. The apparatus of claim 1, wherein the apparatus is configured to clock gate circuitry of the content-addressable memory in response to detecting the particular state.

5. The apparatus of claim 1, further comprising:
   a cache; and
   a load queue that includes the content-addressable memory, wherein the first field indicates a load address for a load operation and the second field indicates whether a cache line corresponding to the load operation remains valid in the cache;
   wherein the apparatus is configured to check the load queue, using the content-addressable memory, for load operations that target a same address as a store operation and are younger than the store operation.

6. The apparatus of claim 5, wherein the at least a portion of the second field includes one or more of:
- a valid indication for a load queue entry;
- a portion of an address of a load corresponding to a load queue entry;
- information indicating an age of a load corresponding to a load queue entry; or
- information indicating whether a load corresponding to a load queue entry has received its load data.

7. A method, comprising:
- comparing, by a content-addressable memory, input data to a first field of multiple entries in the content-addressable memory, using multiple input lines to provide the input data for comparison with the entries, and outputting a second field from one or more matching entries;
- detecting a particular state of an apparatus that includes the content-addressable memory based on at least a portion of the second field of the entries; and
- separately controlling toggling of the input lines for different portions of the content-addressable memory based on data in the second field of entries in the different portions of the content-addressable memory in response to detecting the particular state, such that toggling is prevented for input lines to at least one portion of the content-addressable memory and toggling is performed for one or more input lines to another portion.

8. The method of claim 7, wherein the content-addressable memory is included in a load queue, the first field indicates a load address for a load operation and the second field indicates whether a cache line corresponding to the load operation remains valid in a cache.

9. The method of claim 7, further comprising:
- clock gating circuitry of the content-addressable memory in response to detecting the particular state.

10. The method of claim 7, wherein the content-addressable memory is a load queue and the apparatus is configured to check the load queue for load operations that target a same address as a store operation and are younger than the store operation.

11. The method of claim 7, wherein the at least a portion of the second field includes one or more of:
- a valid indication for a load queue entry;
- a portion of an address of a load corresponding to a load queue entry;
- information indicating an age of a load corresponding to a load queue entry; or
- information indicating whether a load corresponding to a load queue entry has received its load data.

12. A non-transitory computer readable storage medium having stored thereon design information that specifies a design of at least a portion of a hardware integrated circuit in a format recognized by a semiconductor fabrication system that is configured to use the design information to produce the circuit according to the design, including:
- a content-addressable memory configured to compare input data to a first field of multiple entries in the content-addressable memory, using multiple input lines to provide the input data for comparison with the entries, and output a second field from one or more matching entries;
- monitor circuitry configured to detect a particular state of the circuit based on at least a portion of the second field of the entries; and
- toggle control circuitry configured to prevent toggling of the input lines in response to the monitor circuitry detecting the particular state, wherein the toggle control circuitry is configured to separately control toggling of input lines for different portions of the content-addressable memory based on data in the second field of entries in the different portions of the content-addressable memory, such that toggling is prevented for input lines to at least one portion of the content-addressable memory and toggling is performed for one or more input lines to another portion.

13. The non-transitory computer readable storage medium of claim 12, wherein the first field indicates a load address and the second field includes a poison indicator.

14. The non-transitory computer readable storage medium of claim 13, wherein the design information further specifies that the circuit includes:
- a cache; and
- a load queue that includes the content-addressable memory, wherein the first field indicates a load address for a load operation and the poison indicator of the second field indicates whether a cache line corresponding to the load operation remains valid in a cache.

15. The non-transitory computer readable storage medium of claim 12, wherein the circuit is configured to clock gate circuitry of the content-addressable memory in response to detecting the particular state.

16. The non-transitory computer readable storage medium of claim 12, wherein the content-addressable memory is a load queue and the circuit is configured to check the load queue for load operations that target a same address as a store operation and are younger than the store operation.

17. The non-transitory computer readable storage medium of claim 16, wherein the at least a portion of the second field includes one or more of:
- a valid indication for a load queue entry;
- a portion of an address of a load corresponding to a load queue entry;
- information indicating an age of a load corresponding to a load queue entry; or
- information indicating whether a load corresponding to a load queue entry has received its load data.

* * * * *